(12) United States Patent
Han et al.

(10) Patent No.: US 7,458,762 B2
(45) Date of Patent: Dec. 2, 2008

(54) APPARATUS AND METHOD FOR POSITIONING SEMICONDUCTOR SUBSTRATE

(75) Inventors: Kwang-Ho Han, Gyeonggi-do (KR); Sun-Kyu Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 662 days.

(21) Appl. No.: 10/775,958

(22) Filed: Feb. 9, 2004

(65) Prior Publication Data

US 2004/0159997 A1 Aug. 19, 2004

(30) Foreign Application Priority Data

Feb. 13, 2003 (KR) .................... 10-2003-009164
Jul. 14, 2003 (KR) .................... 10-2003-047973

(51) Int. Cl.
*B65G 49/07* (2006.01)
(52) U.S. Cl. .................... 414/781; 414/936; 414/816
(58) Field of Classification Search ................ 414/147, 414/148, 160, 217, 222, 935, 939, 936, 781, 414/816; 294/1.1
See application file for complete search history.

(56) References Cited

U.S. PATENT DOCUMENTS

| | | | | |
|---|---|---|---|---|
| RE30,601 E | * | 5/1981 | Horr et al. .................... 355/76 |
| 5,000,652 A | * | 3/1991 | Christensen et al. ...... 414/744.3 |
| 5,421,056 A | * | 6/1995 | Tateyama et al. ............. 15/302 |
| 5,762,391 A | * | 6/1998 | Sumnitsch ............... 294/119.1 |
| 6,168,427 B1 | * | 1/2001 | Cho et al. .................... 432/241 |
| 6,202,528 B1 | * | 3/2001 | Morgan ....................... 83/824 |
| 6,393,337 B1 | * | 5/2002 | Perlov et al. ................ 700/229 |
| 6,601,313 B2 | * | 8/2003 | Shin et al. ..................... 33/645 |
| 6,612,589 B2 | * | 9/2003 | Saito .......................... 279/110 |
| 6,932,558 B2 | * | 8/2005 | Wu ............................ 414/757 |
| 7,226,055 B1 | * | 6/2007 | Bettencourt et al. ......... 279/106 |
| 2003/0219333 A1 | * | 11/2003 | Takeuchi ................. 414/744.6 |

FOREIGN PATENT DOCUMENTS

KR 2003-0012479 2/2003

\* cited by examiner

*Primary Examiner*—James Keenan
(74) *Attorney, Agent, or Firm*—Marger Johnson & McCollom, P.C.

(57) ABSTRACT

The disclosure is a baking apparatus including a susceptor, lift pins, and guiding blocks positioned at the edge of the susceptor to lead a wafer to be exactly positioned on the susceptor. The guiding blocks are linearly movable within a range of a semidiameter of a plate. A wafer is partially mounted on a wafer guide, being inclined against the susceptor, and thereby may heats uniformly.

15 Claims, 11 Drawing Sheets

APPARATUS AND METHOD FOR POSITIONING SEMICONDUCTOR SUBSTRATE

This application relies for priority upon Korean Patent Application No. 2003-9164 filed on Feb. 13, 2003, and Korean Patent Application No. 2003-47973 filed on Jul. 14, 2003, the contents of which are herein incorporated by reference in their entirety.

FIELD OF THE INVENTION

The present invention generally relates to semiconductor manufacturing apparatuses and methods and more specifically, to positioning apparatuses and methods for positioning semiconductor substrates.

BACKGROUND OF THE INVENTION

With higher integration densities of semiconductor devices, their chip scales are minimized due to their reduced critical dimensions. These increased integration rates require improved photolithographic technologies for building circuit patterns having finer resolutions. This photolithography technology generally includes the steps of depositing, soft-baking, exposing, hard-baking, and then developing the subject semiconductors devices.

In baking wafers, an apparatus may be employed including a susceptor on which a wafer is mounted, and a plurality of guiding blocks for positioning the wafer on the susceptor. The susceptor may include a heating plate for warming the wafer, and a spacer for supporting the edges of the wafer on the heating plate. The wafer is moved into a reaction chamber by a transfer arm, and is then mounted on the susceptor by a lift pin.

During these operations, a wafer may be incorrectly placed on the susceptor in a sloped position. This situation occurs when the edges of the wafer are partially placed on the guiding blocks. This can occur due to malfunctions or positioning errors with respect to the transfer arms. Such an inclinedly positioned wafer may be irregularly heated causing manufacturing defects therein, and, in the extreme resulting in bending or cracking of wafer.

Furthermore, while a higher temperature during the baking process increases the expansion rate of a wafer, the guiding blocks are disposed at a constant distance from a wafer regardless of the processing temperature. Therefore, a wafer may engage the guiding blocks during a high temperature processing operation such as during baking.

SUMMARY OF THE INVENTION

It is, therefore, an object of the present invention to provide an apparatus and method capable of safely positioning a wafer during a high temperature process.

According to an aspect of the present invention, there is provided an apparatus for manufacturing semiconductor devices, including: a susceptor on which a substrate is settled; lift pin assembly for loading the substrate on the susceptor; a plurality of guiding blocks disposed around the edge of the susceptor, rendering the substrate to be settled at a normal position on the susceptor; and a guiding block transfer unit for moving the guiding blocks on the susceptor.

The susceptor includes: a plate; and a spacer disposed at the edge of the plate, on which the edge of the substrate is laid, including a guiding lane leading a motion of the guiding block. Each of the guiding blocks linearly moves along the guiding lane within a range of semidiameter of the susceptor.

The guiding block transfer unit includes: a shaft rotating by a driver in a predetermined range, being perpendicular to the driver; a plurality of supporting rods horizontally combined with the shaft; and a plurality of transfer rods coupled between the supporting rods and the guiding blocks, the transfer rods being pivotally coupled to the supporting rods. When the shaft rotates, the guiding blocks move along the guiding lanes and the transfer rods pivot. The transfer rod includes: a horizontal portion pivotally coupled to the supporting rods; a vertical portion coupled upward to the horizontal portion; and a connection portion coupled to the vertical portion pivotally and the guiding block.

In the embodiment, the guiding blocks move with displacement positions variable depending on a processing temperature.

In the embodiment, the transfer rod is coupled to the guiding block by means of openings formed in the guiding block and transfer rod, a bolt inserted through the openings, and a nut, in a hollow formed a sidewall of the susceptor. The bolt is set to be movable in the opening of the transfer rod to allow variations of the displacement position.

In the embodiment, an elastic element is provided being connected between the transfer rod and the plate in a hollow formed in a sidewall of the plate, whereby the elastic element aids the guiding block to return a predetermined position. And, a testing unit is used for inspecting a current positioning state of the substrate on the susceptor, including: a vacuum line led from a vacuum pump, extending to the upper space of the plate; and a sensor for detecting pressure in the vacuum line.

In the embodiment, the apparatus may be used for baking a semiconductor substrate.

The present invention also provides a method of positioning a substrate on a susceptor during a semiconductor device fabricating process, including the steps of: transferring and loading the substrate on lift pins protruding above the susceptor through openings formed in the susceptor; descending the lift pins; and moving guiding blocks, which are disposed at the edge of the susceptor, to render the substrate on a normal position of the susceptor.

The guiding blocks moves in strokes backward and forward with predetermined distance when the lift pins descend under the top level of the susceptor. The lift pins descend when the guiding blocks move on the susceptor outward and the guiding blocks move inward on the susceptor up to a displacement position when the lift pins descend under the top level of the susceptor. The method may further include the step of testing a current positioning state of the substrate.

The forgoing and other objects, features and advantages of the invention will be apparent from the description of the preferred embodiment of the invention, as illustrated in the accompanying drawings.

DESCRIPTION OF THE PREFERRED EMBODIMENT

It should be understood that the description of the preferred embodiment is illustrative and that it should not be taken in a limiting sense. Embodiments of this invention will be explained in conjunction with the drawings.

This preferred embodiment according to the present invention will describe an apparatus and method for carrying out a semiconductor baking process. However, other equipment including a susceptor on which a wafer is mounted may be practiced in accordance with the present invention.

In this embodiment, "displacement position" of guiding blocks means the position of the guiding blocks during a baking process. "Awaiting position" of the guiding blocks is the position apart from the center of a susceptor, more spaced than the displacement position therefrom, to provide a sufficient margin for loading a wafer on the susceptor. "Normal position" of a wafer means the predetermined position proper to conduct a process (e.g., a baking process). The guiding blocks at the displacement position and the awaiting position are referred by the solid and broken lines in FIG. 2, 300 and 300', respectively.

Figure 1:
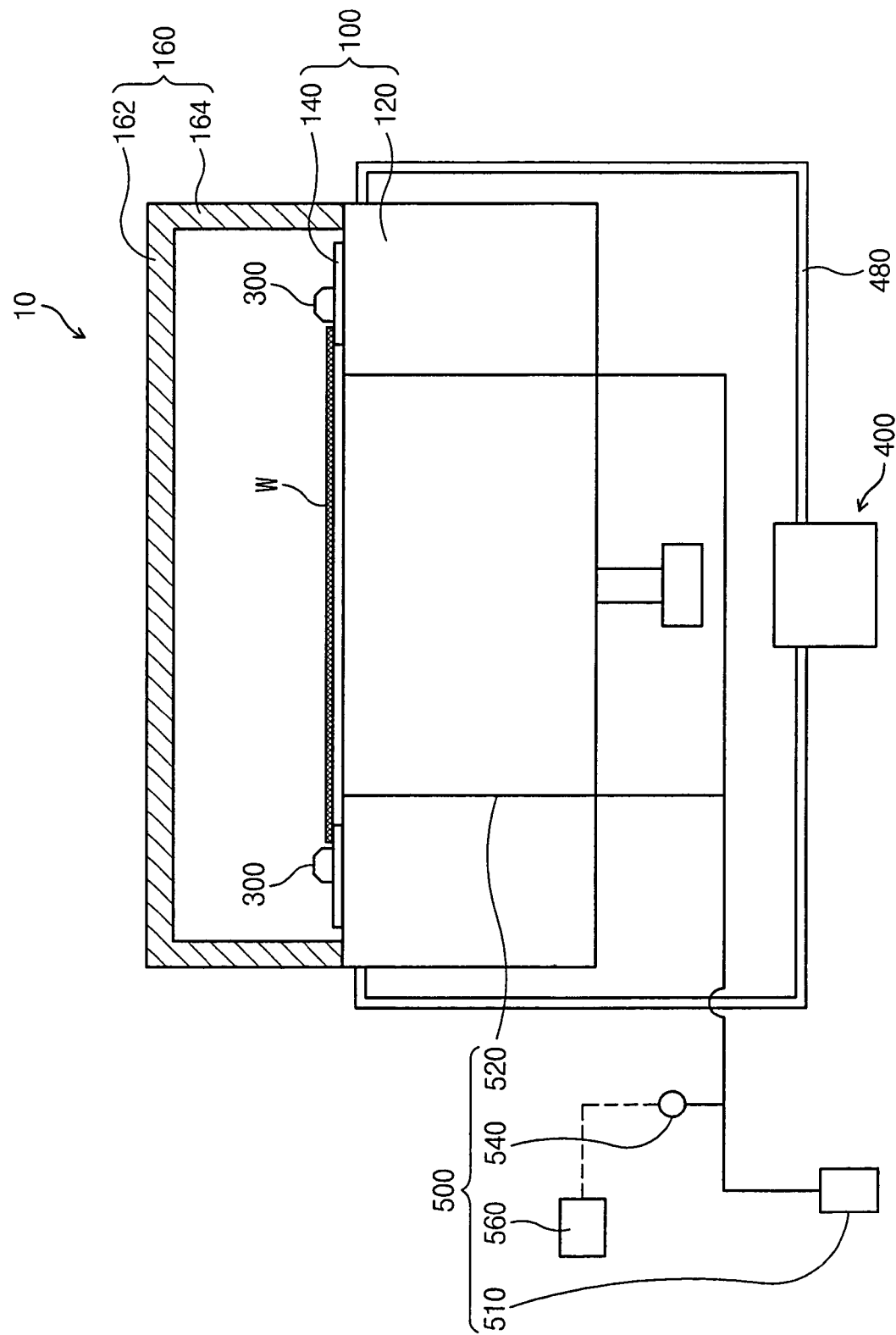
FIG. 1 is a schematic of a baking apparatus according to a preferred embodiment of the invention.
Figure 2:
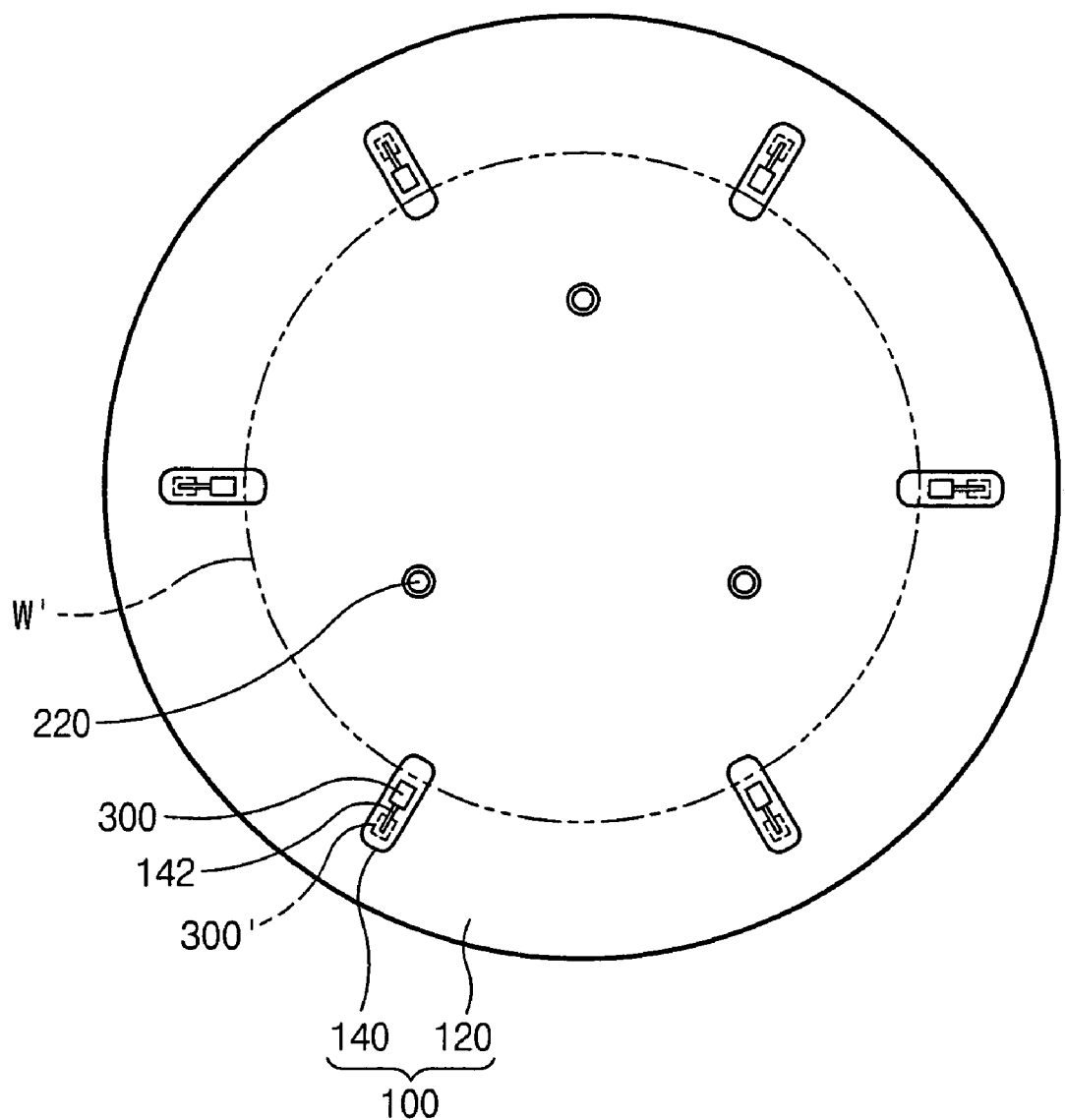
FIG. 2 is a plan view of a susceptor employed in the baking apparatus shown in FIG. 1.
Figure 3:
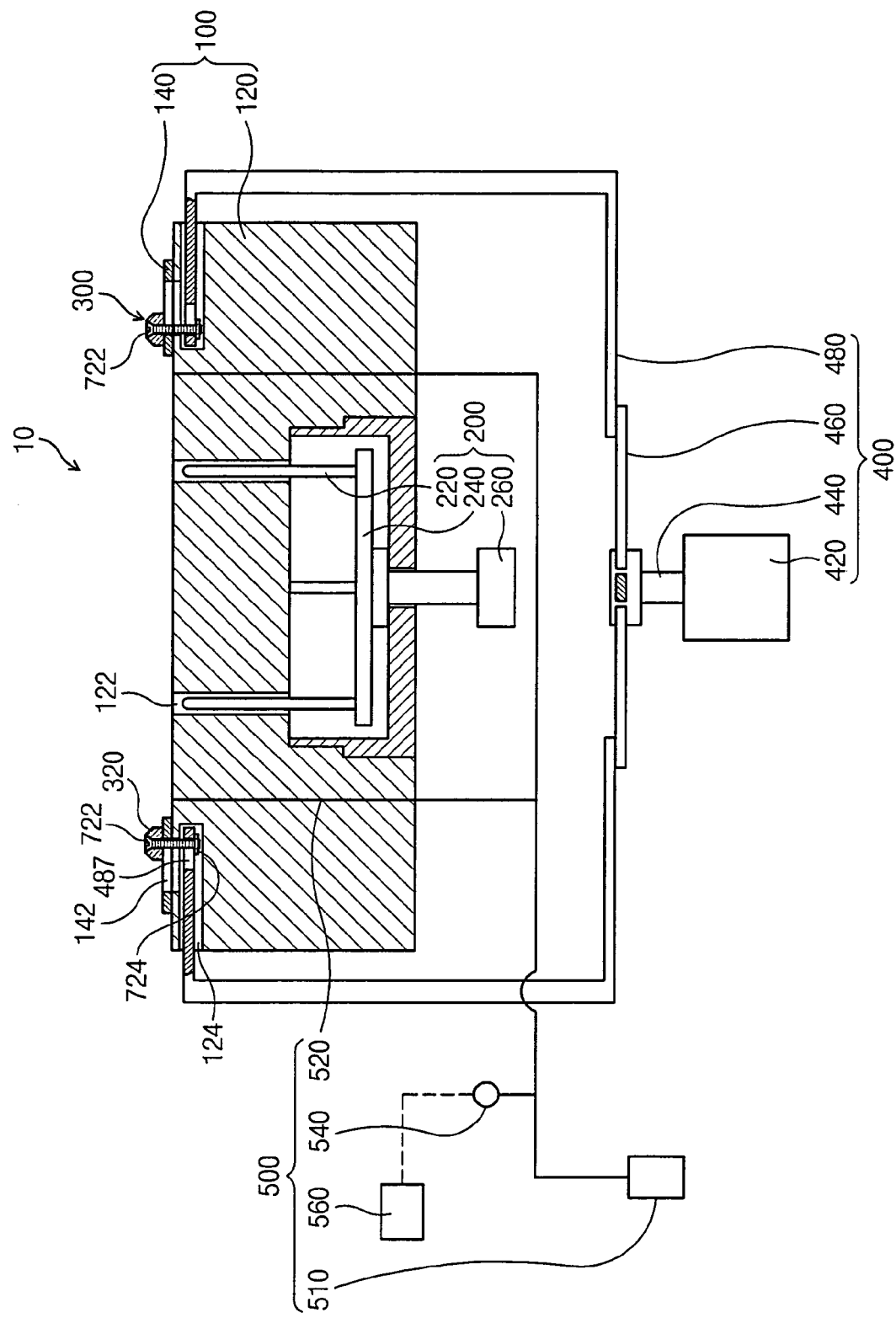
FIG. 3 is a sectional view illustrating an internal structure of the susceptor shown in FIG. 1 or 2.

FIG. 1 illustrates a schematic view of an apparatus 10 which can be employed in a semiconductor fabrication process wherein a wafer is subjected to a baking operation. FIGS. 2 and 3 show the plane and sectional features in the area where a wafer is positioned. The apparatus 10 includes a susceptor 100, a lift pin assembly 200, guiding blocks 300, a guide block mover 400, and a tester 500.

The susceptor 100, which is provided to accommodate a semiconductor substrate, such as a wafer W, comprises a plate 120 and spacers 140. The plate 120 includes heating elements (not shown) such as heating coils to warm up a wafer to a proper temperature for processing. The top of the plate 120 is round and flattened. The spacers 140 are installed at the top edges of the plate 120 to support the wafer W, contacting with the edges of the wafer W. The spacers 140 may be provided at regular intervals and may be from three to six in number.

The wafer W is separated from the plate 120, so that it is not in contact with the plate 120 that is heated up to a high temperature during a process. At the top of the susceptor 100, a cover 160 is provided to facilitate an airtight condition during processing of the semiconductor substrate. The cover 160 is cylinder-shaped and includes an upper plate 162, and a sidewall 164 which extends downwardly from the edge of the upper plate 162.

The lift pin assembly 200 (FIG. 3), driven by a robot arm (not shown), moves the wafer W above and onto the susceptor 100. Assembly 200 comprises lift pins 220, a support plate 240 for the pins 220, and an elevator device 260. The lift pins 220, which are joined to the upholding plate 240 in a square arrangement, receiving the wafers W from the robot arm. The support plate 240 is connected to the elevator device 260, such as a hydraulic/pneumatic cylinder, and is movable to a plurality of positions in an upward and downward direction. The lift pins 220 are inserted into openings 122 in the support plate 120 for vertically movement within the openings 122.

The wafer W is transferred to the lift pins 220 by means of the robot arm when the lift pins 220 ascend to protrude above the top of the plate 120 and then mounted on the susceptor 100 when the lift pins 200 descend under the top of the plate 120 by way of the openings 122.

The guiding blocks 300 lead the wafer W to be positioned on an accurate position within the susceptor 100. The guiding blocks 300 are disposed on the spacers 140, each including slopes 320 formed inside from the top surface thereof. The wafer W slips down along the slope 320 to be positioned on the accurate position when it strays from the accurate position to result its edges to be partially laid on the tops of the guiding blocks.

The baking apparatus 10 also includes a guiding block transfer unit 400 for moving the guiding blocks 300 in a predetermined distance to the displacement position or the awaiting position. It is desirable to render the guiding blocks 300 to be moved linearly along guiding lanes 142 within the range of the radius of the plate 120. The guiding lanes 142 are formed in the spacers 140 to facilitate the linear movement of the guiding blocks 300. The guiding lanes 142 are shaped in the form of apertures (or openings) or trenches. The guiding blocks 300 may include underlying projections (not shown) which are movably inserted into the guiding lanes 142.

Figure 4:
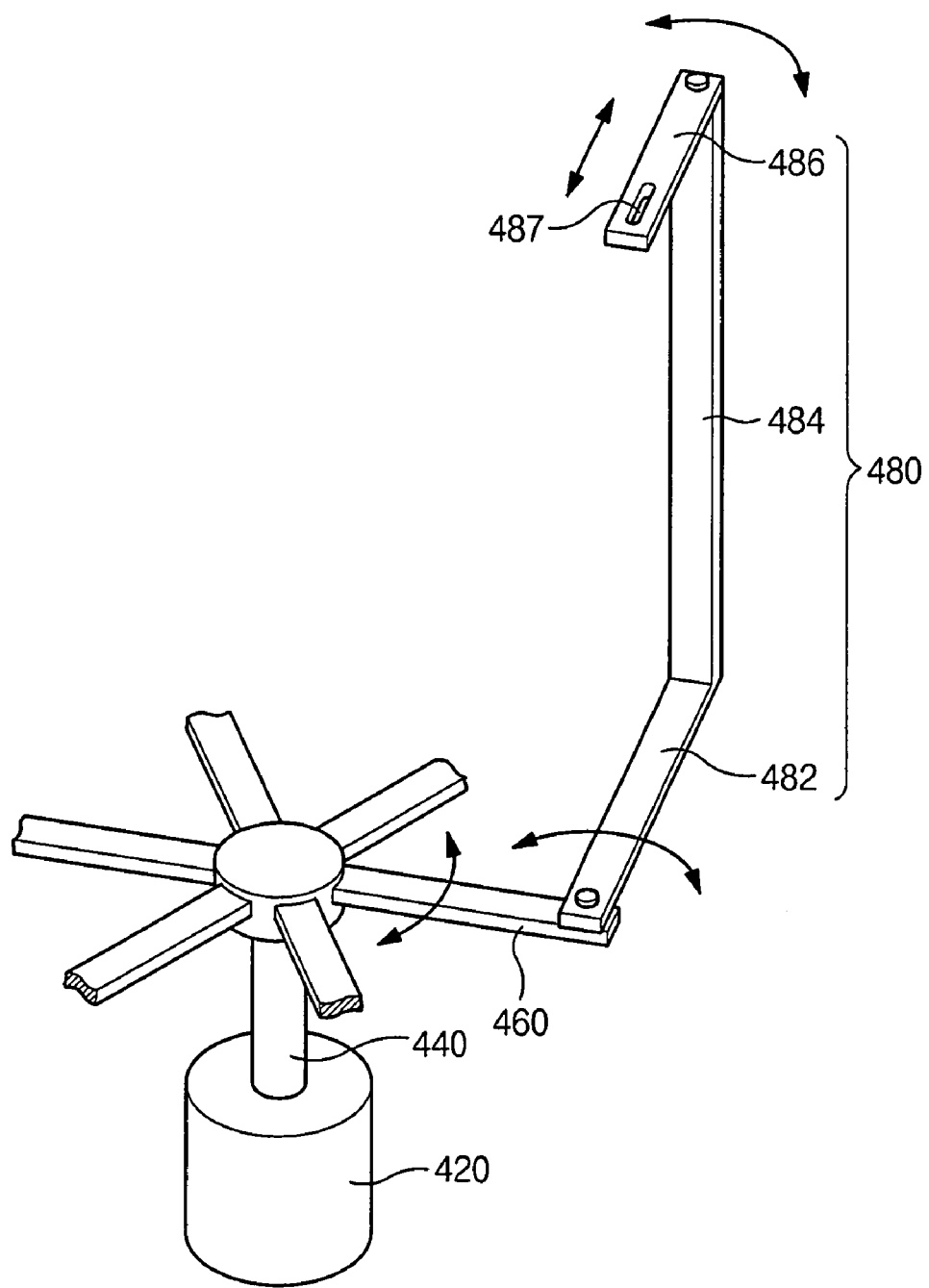
FIG. 4 is a perspective view of a guiding block transfer unit.

Referring to FIG. 4, the guiding block transfer unit 400 is constructed of a driver 420, a shaft 440, supporting rods 460, and transfer rods 480. The shaft 440 is vertically connected to the driver 420 such as a stepping motor, hydraulic or pneumatic cylinder, or an actuator, and is rotated on its axis by the driver 420. The topside of the shaft 440 is horizontally combined with the supporting rods 460 at constant intervals, and in the same number as that of the guiding blocks 300. The other ends of the supporting rods 460 are joined with the transfer rods 480 which are each connected to the guiding blocks 300. The supporting rods 460 and the transfer rods 480 are pivotally joined one to the other. The transfer rods 480 move in a range of angles when the supporting rods 460 are rotated. This enables the guiding blocks 300 to be linearly movable along the guiding lanes 142.

Each of the transfer rods 480 is composed of a horizontal portion 482, a vertical portion 484, and a connection portion 486, respectively. The horizontal portion 482 is linearly connected to the supporting rod 460 by means of a pivotable section on the same plane. The vertical portion 484 perpendicularly extends upwardly from the end of the horizontal portion 482. The connection portion 486 is disposed parallel to the horizontal portion 482, and is pivotally attached to the end of the vertical portion 484. While the horizontal and vertical portions, 482 and 484, may comprise a single body portion, they may also be combined by attachment devices such as screws.

Figure 5:
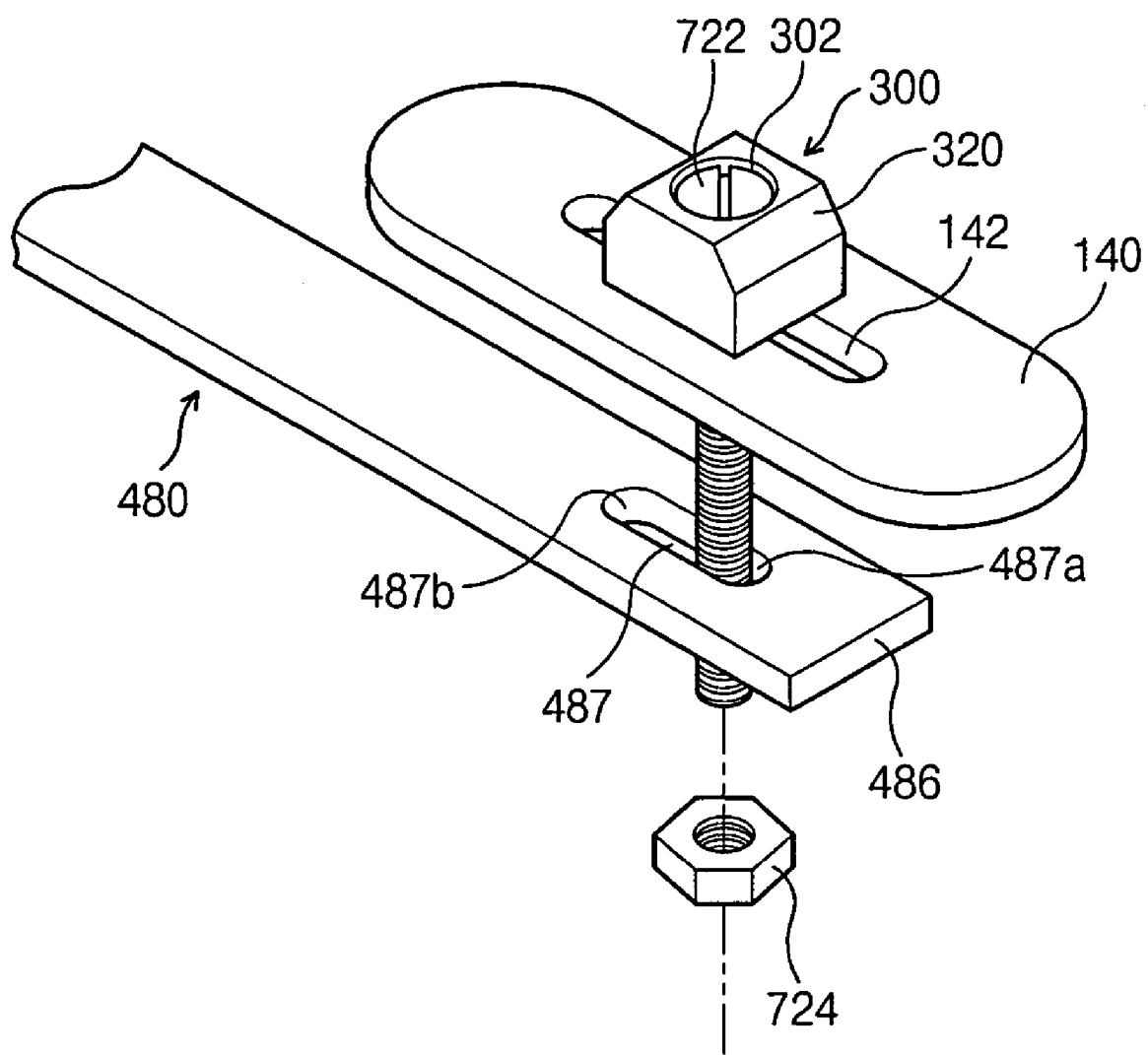
FIG. 5 is a perspective view illustrating the feature of combination with a guide block, a spacer, and a transfer rod.
Figure 6A:
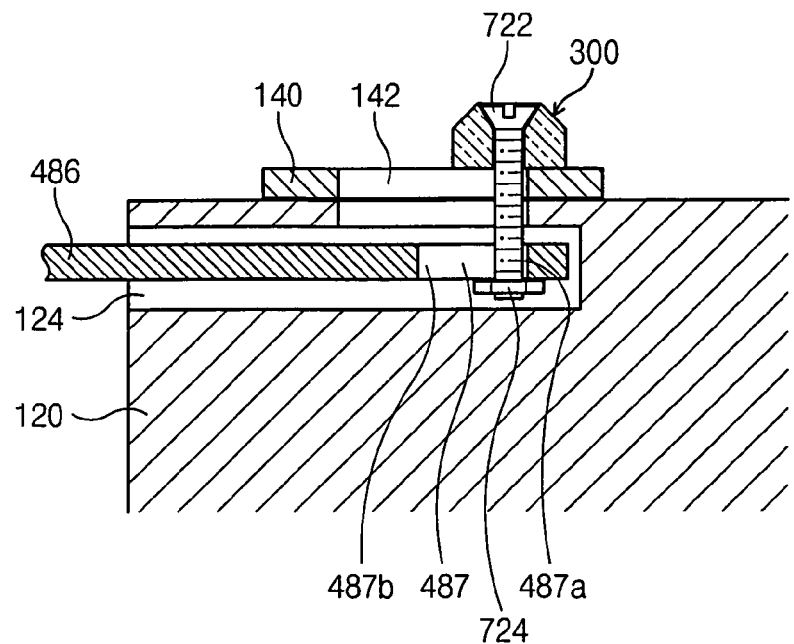
FIGS. 6A and 6B are sectional views illustrating features of displacement for the guiding block.
Figure 6B:
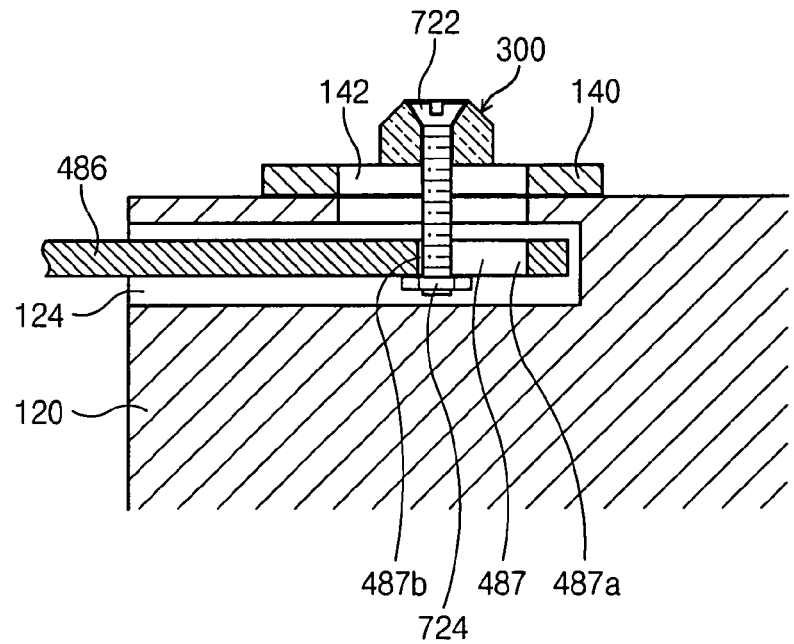

FIG. 5 depicts a feature of combining a guiding block and a transfer rod, utilizing, for example, guiding block 300, spacer 140, and transfer rod 480, respectively. Referring to FIGS. 5, 6A and 6B, the connection portions 486 of the transfer rods 480 are inserted into hollows 124 formed in the sidewalls of the plate 120 under the spacers 140. In each illustrative structure, the guiding block 300 and the transfer rod 480 are combined by means of, for example, a bolt 722 and a nut 724, through openings 302 and 487, to penetrate the center of the guiding block 300 and the end of the connection portion 486. The bolt 722 is coupled to the nut 724 through the opening in the guiding block 300, the holed guiding lane 142 in the spacer 140, and the opening in the connection portion 486 of the transfer rod 480.

The wafer W expands with heat during a baking process. This narrows the distance between the wafer W and the guiding blocks 300 at the displacement positions. At high processing temperature, the wafer W abuts against the guiding blocks 300.

Such abutting action can be overcome by adjusting the displacement position of the guiding blocks 300 in accordance with the processing temperature in the baking apparatus 10. In the present baking apparatus 10, the opening 487 in the connection portion 486 of the transfer rod 480 is elongated along the span of the connection portion 486, as in the case of the guiding lane 142. Preferably, the length of the elongate opening is larger than the diameter of the bolt 722. Thus, the elongate opening 487 enables a combinable position between the guiding block 300 and the transfer rod 480 to be varied, which adjusts the displacement position of the guiding block 300. FIGS. 6A and 6B exemplarily show available features of the displacement positions for the guiding block 300 combined with the transfer rod 480. The location of the guiding block is dependent on whether relatively lower or high processing temperatures is employed.

In a lower temperature scenario, as shown in FIG. 6A, the bolt 722 is fixed by the nut 724 at a position adjacent to one end 487a of the opening 487, establishing the displacement position of the guiding block 300 in a location inward on the spacer 140. In a higher temperature scenario, as shown in FIG. 6B, the bolt 722 is fixed by the nut 724 at a location adjacent to the other end 487b of the opening 487, establishing the displacement position of the guiding block 300 in a location outward on the spacer 140. For instance, the relative location may set about 0.5 mm for a distance between the wafer (e.g., in diameter of 300 mm) and the guiding block 300 at the locating position of them, about 2.0 mm for the length of the opening 487 in the transfer rod 480 (i.e., a distance between both ends 487a and 487b).

Figure 7:
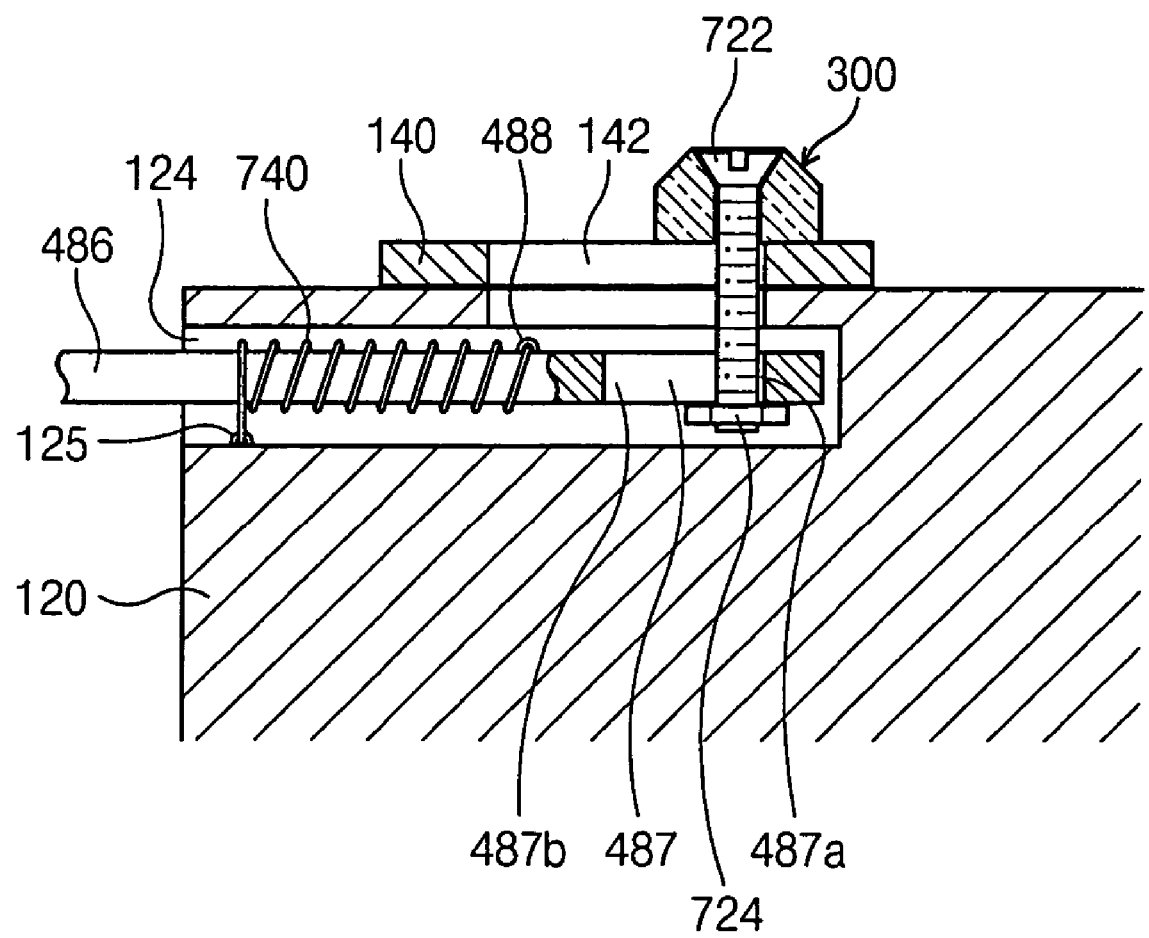
FIG. 7 is a sectional view illustrating the feature that an elastic element is installed in an insertion hollow formed at the side of a plate.

As shown in FIG. 7, a resilient element 740, such as a spring or coil, may be inserted into the hollow 124 formed in the sidewall of the plate 120, for preventing a heating process from continuing to operate even when the guiding block 300 is positioned at the displacement position in the condition of an abnormal operation of the guiding block transfer unit 400. The resilient element 740 surrounds the connection portion 486 of the transfer rod 480, both ends of which attach onto a link 488 embedded at the connection portion 486 and a link 125 embedded in the hollow 124, respectively. The resilient element 740 maintains its equilibrium, neither compressed nor stretched, when the guiding block 300 is set on the displacement position. The resilient element 740 also has a modulus of elasticity designed to minimize vibration when it is relieved from a compressed state.

Figure 8A:
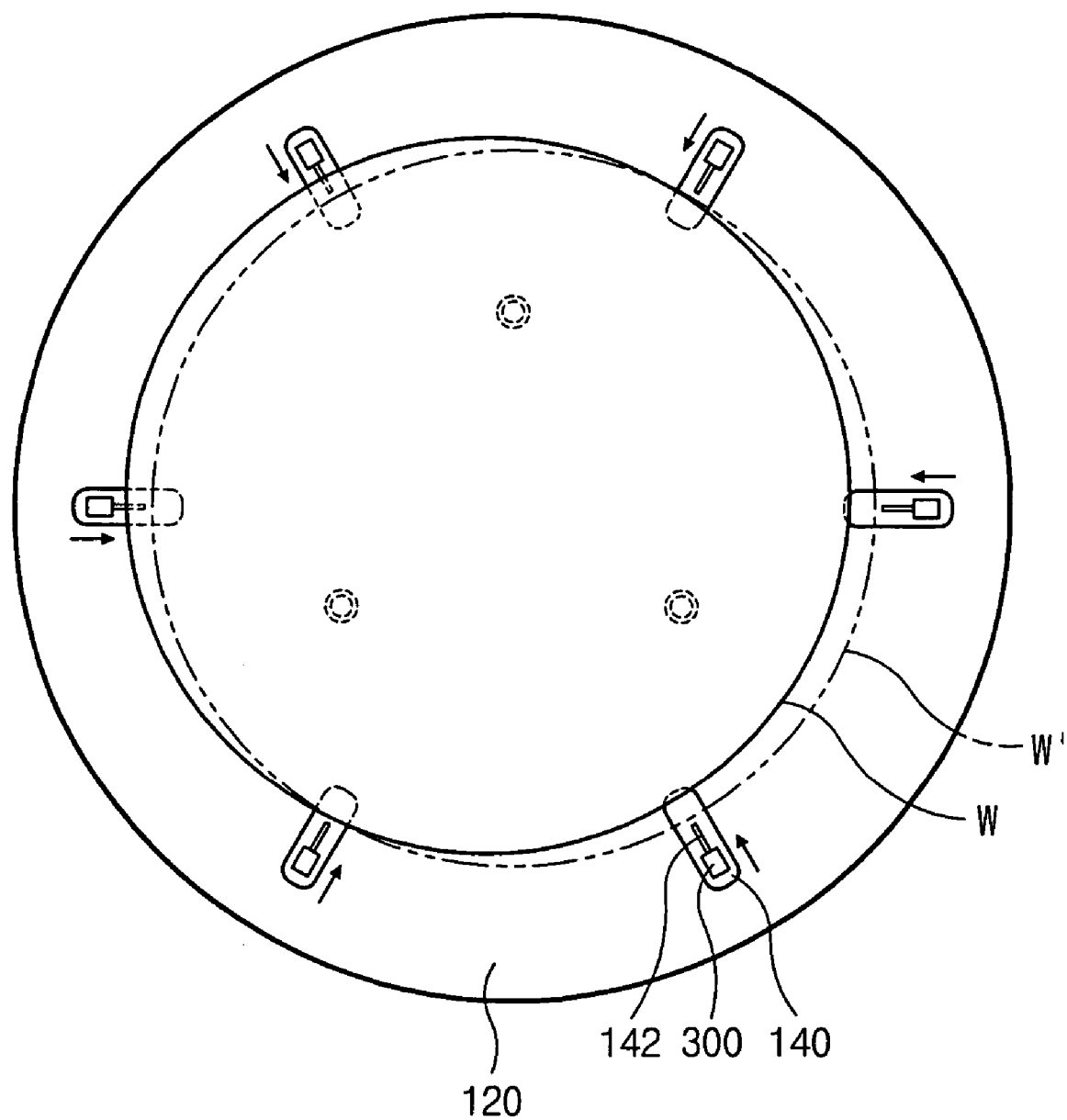
FIGS. 8A and 8B illustrate the sequence of moving the guiding block to position a wafer at a normal position.
Figure 8B:
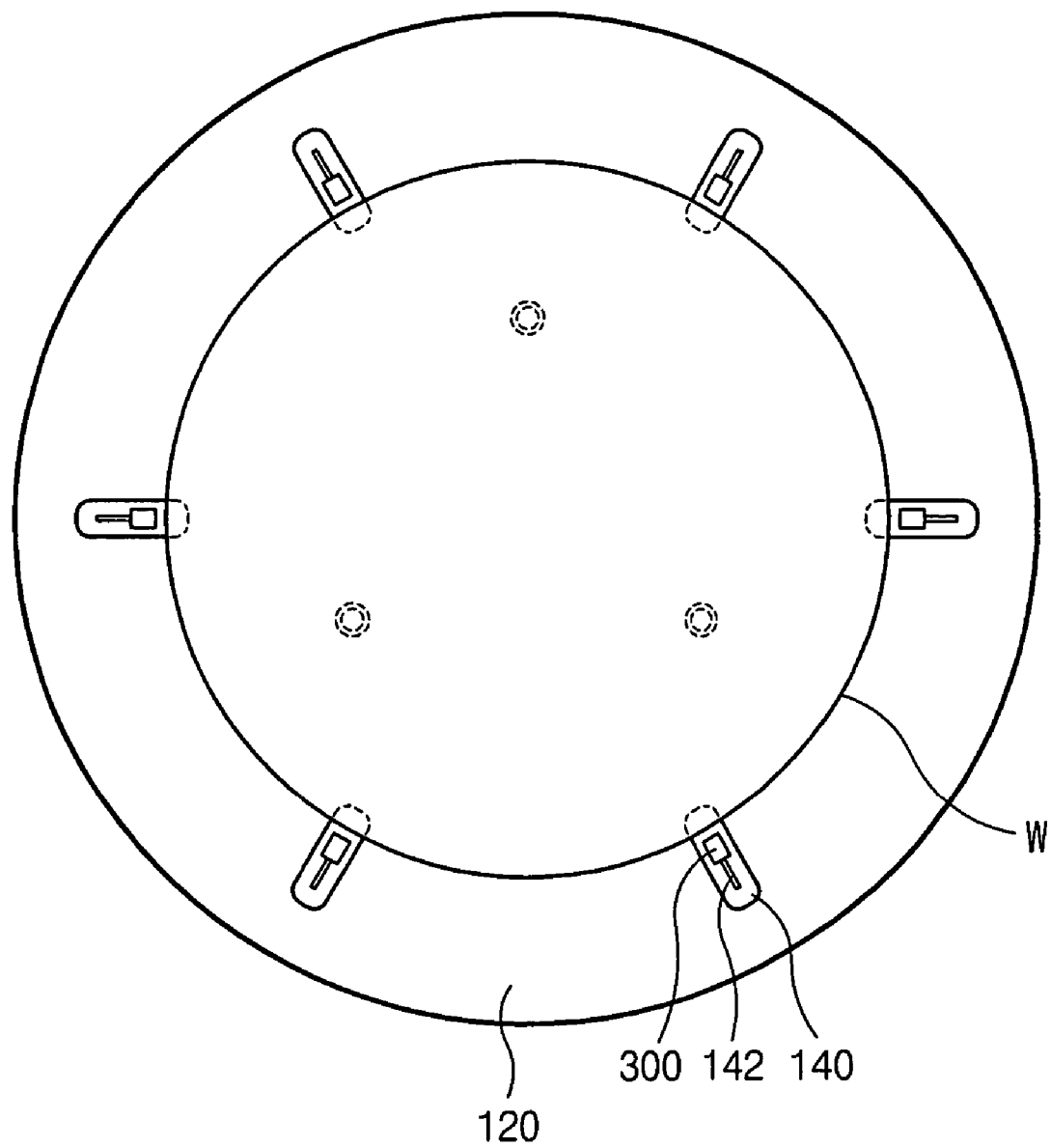

FIGS. 8A and 8B illustrate a procedure of positioning the wafer W in a normal position by means of the guiding blocks 300. In FIG. 8A, the solid circle referred to as W denotes a wafer which is out of the normal position. The broken line referred to as W' denotes the normal position on which the wafer should be placed for processing. When the wafer is loaded onto the susceptor, the guiding blocks 300 are moved to their aligning positions before the lift pins 220 descend. This pre-alignment operation permits sufficient spacing of the wafers and prevents the wafer edges from being partially laid onto the guiding blocks 300. Thereafter, if the top ends of the lift pins 220 are inserted into the openings 122, the guiding blocks 300 will move to their displacement positions to correct the positional error of the wafer. As a result, the wafer W will be positioned in their normal position as shown in FIG. 8B.

Figure 9A:
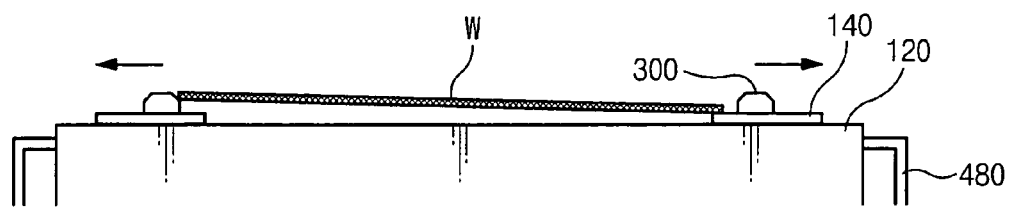
FIGS. 9A, 9B and 9C illustrate another features of sequentially moving the guiding block to position a wafer at a normal position.
Figure 9B:
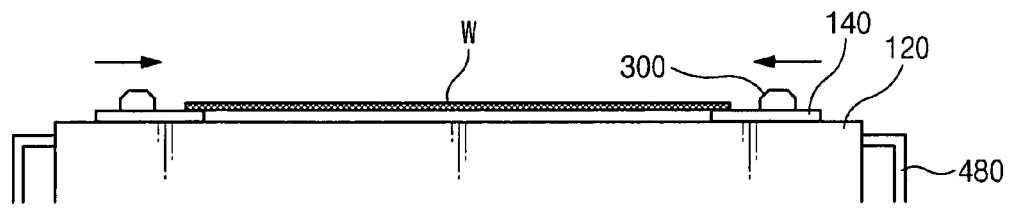
Figure 9C:
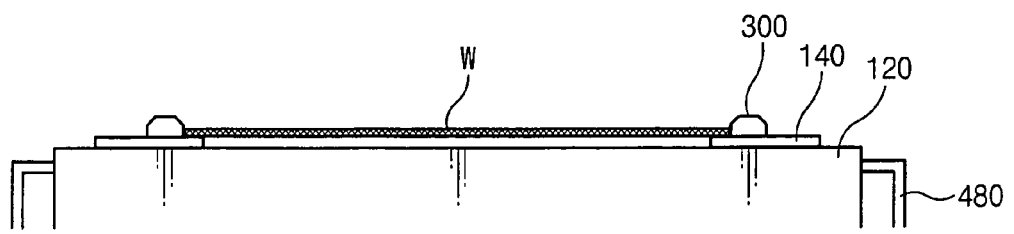

FIGS. 9A, 9B, and 9C illustrate sequential changes of positioning the guiding blocks 300 to fit the wafer W on the normal position. First, as shown in FIG. 9A, the lift pins 220 on which the wafer W is mounted go down after the guiding blocks 300 have moved into the displacement positions. When the top ends of the lift pins 220 are inserted into the openings 122 by elevating the lift pins 220, the guiding blocks 300 move to the awaiting positions, and are then returned to the displacement positions, as shown by the arrows in FIGS. 9A and 9B. Even when the edges of the wafer W are initially laid on the guiding blocks 300, the realignment of the guiding blocks 300 enables the wafer W to be set in the normal position as shown in FIG. 9C.

Returning to FIG. 1, the apparatus 10 is associated with a testing unit 500 for monitoring whether or not the wafer W is positioned in the normal position on the susceptor 100 to avoid adversely affecting the baking process due to the misaligned placement of the wafer edges on the guiding blocks 300 which makes the wafer slant. The testing unit 500 is constructed of a vacuum pump 510, a vacuum line 520 extending from the vacuum pump 510, a sensor 540 for gauging pressure in the vacuum line 520, and a display panel 560 showing a value of pressure calibrated by the sensor 540. The vacuum line 520 extends into the space between the rear of the wafer W and the plate 120. The pressure in the vacuum line 520 is detected by the sensor 540 when the vacuum pump 510 is started before the baking process begins. The sensor 540 can be a digital vacuum sensor, and the amount of pressure in the vacuum line may be more accurately established without damaging the wafer W. If, however, a pressure value measured by the sensor 540 becomes out of a predetermined range due to the positional error of the wafer W (i.e., the wafer W is laid on the guiding blocks 300), an alarm can be generated to inform an operator of the misalignment of the wafer W. Alternatively, vacuum holes may be provided in the spacer 140 around which the edges of the wafer W can be mounted in the normal position, connected to the vacuum line 520.

Figure 10:
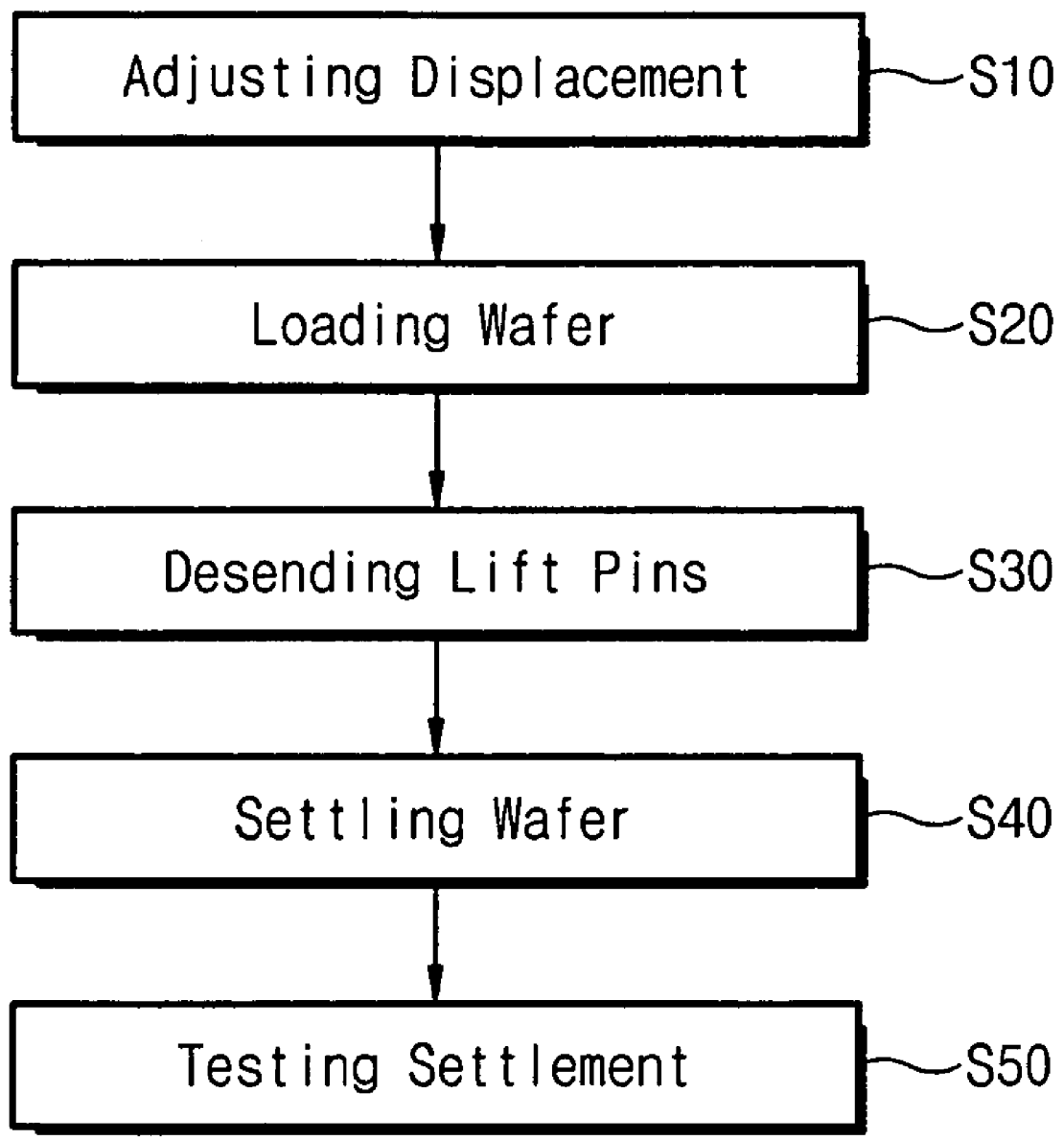
FIG. 10 is a flow chart of processing steps for positioning wafers according to the invention.

FIG. 10 summarizes a sequential flow of positioning the wafer W onto the susceptor 100. First, the displacement positions of the guiding blocks 300 are adjusted wherein the bolt 722 is inserted into the openings 302 and 487 respectively formed at the guiding block 300 and the connection portion 486 of the transfer rod 480. The transfer rod 480 moves within a predetermined range to set the combining position of the guiding block 300 and the transfer rod 480. Then, the bolt 722 is joined with the nut 724 to fix the guiding block 300 on the transfer rod 480 (step S10).

Next, the cover 160 is elevated from the plate 120 so that the lift pins 220 protrude above the top surface of the plate 120. The wafer W is transferred to the upper work space of the plate 120 by a robot arm to which it is adhered. The wafer W is then laid onto the lift pins 220 by the robot arm (step S20). The lift pins 220 are lowered, and the cover 160 is closed (step S30). If the lift pins 220 descend under the upper surface of the plate 120 through the openings 122, the driver 420 makes the guiding blocks 300 move from the displacement position to the awaiting position and then back to the displacement position (step S40). The realigning of the guiding blocks 300 causes the wafer W to be positioned on the normal position of the susceptor 100 even when the wafer W is misaligned with respect to the normal position or is mounted on the guiding blocks 300. Thereafter, the testing unit 500 checks whether the wafer W is positioned at the normal position on the susceptor 100 (step S50). The vacuum pump is actuated and the sensor 540 detects the pressure in the vacuum line 520. If the measured value of the pressure in the line 520 is under the predetermined range, the baking process is carried out. On the other hand, if the pressure in line 520 is outside of the predetermined range of pressure, an audible signal is generated to inform an operator of misaligned status of the wafer W.

In the embodiments described so far, while the guiding blocks 300 are linearly movable by the single driver, it may also be possible for the guiding blocks 300 to be continuously moved in a generally circular path. It is also possible to transfer each guiding block by each driver.

According to the baking apparatus and method of the present invention, it is possible to prevent a misaligned placement of a wafer in which the wafer is positioned away from the normal position or the wafer edges are locally mounted on the guiding blocks.

Moreover, a wafer can be transferred to the normal position anyway even when the guiding block driver operates abnormally, because the guiding blocks can be returned to a predetermined displacement position for carrying out the process using a resilient element.

Further, there is provided of an inspecting function by the testing unit to check out whether a wafer is safely laid on the upper surface of the susceptor before continuing the baking process. This prevents carrying out the process with misaligned placement of the wafer on the susceptor.

Although the preferred embodiments of the present invention have been disclosed for illustrative purposes, those skilled in the art will appreciate that various modifications, additions and substitutions are possible, without departing from the scope and spirit of the invention as described in the accompanying claims

What is claimed is:

1. An apparatus for manufacturing semiconductor devices, comprising:
    a susceptor on which a substrate is positioned;
    a lift pin assembly for loading the substrate onto the susceptor;
    a plurality of guiding blocks disposed around an edge of the susceptor, for positioning the substrate at an aligned position on the susceptor; and
    a guiding block transfer unit for collectively moving the guiding blocks radially on the susceptor, the guiding block transfer unit comprising a plurality of transfer rods, with each transfer rod coupled to a respective one of the guiding blocks by an attachment assembly extending through elongate openings formed in the guiding block and transfer rod, the attachment assembly being movable within the opening in the transfer rod to facilitate movement of the guiding block to a plurality of predetermined positions.

2. The apparatus of claim 1, wherein the susceptor comprises:
    a plate; and
    a spacer disposed at the edge of the plate on which the edge of the substrate is laid, said spacer including a guiding lane along which the guiding blocks are moved.

3. The apparatus of claim 2, wherein each of the guiding blocks moves along the guiding lane within a range defined by a radius of the plate.

4. The apparatus of claim 3, wherein the guiding block transfer unit comprises:
    a shaft rotatable by a driver in a predetermined range of distances; and
    a plurality of horizontally-extending supporting rods attached to the shaft,
    wherein the plurality of transfer rods are connected between the supporting rods and the guiding blocks, the transfer rods being pivotally coupled to the supporting rods so that when the shaft rotates, the guiding blocks move along the guiding lanes and the transfer rods pivot.

5. The apparatus of claim 4, wherein each of the transfer rods comprise:
    a horizontal portion pivotally coupled to the supporting rods;
    a vertical portion coupled to the horizontal portion; and
    a connection portion pivotally coupled to the vertical portion and the guiding block.

6. The apparatus of claim 5, further comprising a resilient element connected between the transfer rod and the plate, the resilient element being capable of moving the guiding block to a predetermined position.

7. The apparatus of claim 3, further comprising a testing unit for determining the location of the substrate on the susceptor.

8. The apparatus of claim 7, wherein the testing unit comprises:
    a vacuum line in communication with a vacuum pump which extends to the upper space of the plate; and
    a sensor for detecting pressure in the vacuum line.

9. The apparatus of claim 1, wherein the guiding blocks are movable to a plurality of positions based on processing temperature.

10. The apparatus of claim 1, which is employed in a baking process conducted during fabricating of said semiconductor devices.

11. A method for manufacturing semiconductor devices, the method comprising:
    providing a susceptor on which a semiconductor substrate is positioned;
    loading the substrate onto the susceptor;
    providing a plurality of guiding blocks disposed around the edge of the susceptor;
    positioning the substrate at a predetermined, aligned position on the susceptor;
    moving the guiding blocks on the susceptor; and
    providing a guiding block transfer unit for collectively and radially moving the guiding blocks on the susceptor, the guiding block transfer unit comprising a plurality of transfer rods, with each transfer rod coupled to a respective one of the guiding blocks by an attachment assembly extending through elongate openings formed in the guiding block and transfer rod, the attachment assembly being movable within the opening in the transfer rod to facilitate movement of the respective one of the guiding blocks to a plurality of predetermined positions.

12. The method of claim 11, which further comprises moving the guiding blocks comprises moving along a guiding lane.

13. The method of claim 11, which further comprises moving the guiding blocks to a plurality of positions based on processing temperature.

14. An apparatus for manufacturing semiconductor devices, comprising:
    a susceptor on which a substrate is positioned comprising a plate, and a spacer disposed at the edge of the plate on which the edge of the substrate is laid, said spacer including a guiding lane along which the guiding blocks are moved;
    a lift pin assembly for loading the substrate onto the susceptor;

a plurality of guiding blocks disposed around an edge of the susceptor, for positioning the substrate at an aligned position on the susceptor;

a guiding block transfer unit for moving the guiding blocks on the susceptor, wherein each of the guiding blocks moves along the guiding lane within a range defined by a radius of the plate;

a shaft rotatable by a driver in a predetermined range of distances;

a plurality of horizontally-extending supporting rods attached to the shaft;

a plurality of transfer rods connected between the supporting rods and the guiding blocks, the transfer rods being pivotally coupled to the supporting rods so that when the shaft rotates, the guiding blocks move along the guiding lanes and the transfer rods pivot, each of the transfer rods including:

a horizontal portion pivotally coupled to the supporting rods;

a vertical portion coupled to the horizontal portion; and a connection portion pivotally coupled to the vertical portion and the guiding block.

15. An apparatus for manufacturing semiconductor devices, comprising:

a susceptor for positioning a substrate thereon, the susceptor comprising a plate, and a spacer disposed at the edge of the plate on which the edge of the substrate is laid, said spacer including a guiding lane along which the guiding blocks are moved;

a lift pin assembly for loading the substrate onto the susceptor;

a plurality of guiding blocks disposed around an edge of the susceptor, for positioning the substrate at an aligned position on the susceptor; and a guiding block transfer unit for moving the guiding blocks on the susceptor, wherein each of the guiding blocks moves horizontally along the guiding lane within a range defined by a radius of the plate, the guiding plate further comprising:

a shaft rotatable by a driver in a predetermined range of distances;

a plurality of horizontally-extending supporting rods, attached to the shaft;

a plurality of transfer rods connected between the supporting rods and the guiding blocks, the transfer rods being pivotally coupled to the supporting rods so that when the shaft rotates the guiding blocks move along the guiding lanes and the transfer rods pivot, each of the transfer rods including:

a horizontal portion pivotally coupled to the supporting rods;

a vertical portion coupled to the horizontal portion; and a connection portion pivotally coupled to the vertical portion and the guiding block.

* * * * *